(12) United States Patent
Chen et al.

(10) Patent No.: US 10,121,613 B2
(45) Date of Patent: Nov. 6, 2018

(54) KEYSWITCH DEVICE, KEYBOARD, AND MEMBRANE CIRCUIT BOARD

(71) Applicant: Chicony Electronics Co., Ltd., New Taipei (TW)

(72) Inventors: Pao-Chin Alan Chen, Taipei (TW); Ching-Cheng Tsai, Keelung (TW); Tsung-Min Chen, New Taipei (TW); Pai-Hsiang Wang, New Taipei (TW); Chun-Wei Lu, New Taipei (TW)

(73) Assignee: Chicony Electronics Co., Ltd., New Taipei (TW)

( * ) Notice: Subject to any disclaimer, the term of this patent is extended or adjusted under 35 U.S.C. 154(b) by 54 days.

(21) Appl. No.: 15/235,123

(22) Filed: Aug. 12, 2016

(65) Prior Publication Data
US 2017/0294278 A1 Oct. 12, 2017

(30) Foreign Application Priority Data

Apr. 12, 2016 (TW) .............................. 105205076 U (51) Int. Cl.
| H01H 9/26 | (2006.01) |
| H01H 13/72 | (2006.01) |
| H01H 13/76 | (2006.01) |
| H01H 13/703 | (2006.01) |
| H01H 13/02 | (2006.01) |
| H05K 1/18 | (2006.01) |

(52) U.S. Cl.
CPC ........ *H01H 13/703* (2013.01); *H01H 13/023* (2013.01); *H05K 1/18* (2013.01)

(58) Field of Classification Search
CPC ............... H01H 13/703; H01H 13/023; H01H 2003/00; H01H 2003/12; H01H 2009/18; H01H 2009/182; H01H 2009/186; H01H 2009/265; H01H 2219/036; H01H 2219/014; H01H 2219/018; H01H 2219/037; H01H 2219/06; H01H 2219/064; H01H 2219/044; H01H 2219/046; H01H 3/00; H01H 3/02; H01H 3/12; H01H 13/70; H01H 13/50; H01H 13/14; H01H 13/00; H01H 13/26; H05K 1/18
USPC ........................................................ 200/5 A
See application file for complete search history.

(56) References Cited

U.S. PATENT DOCUMENTS

| 5,397,867 | A * | 3/1995 | Demeo ................ G02B 6/0043 200/311 |
| 6,680,678 | B2 * | 1/2004 | Chiu ...................... H03M 11/22 200/5 A |
| 2004/0174339 | A1 | 9/2004 | Liao et al. |

(Continued)

*Primary Examiner* — Anthony R. Jimenez
(74) *Attorney, Agent, or Firm* — CKC & Partners Co., Ltd.

(57) ABSTRACT

A keyswitch device includes a base plate, a membrane circuit board, a light source, and a keyswitch assembly. The membrane circuit board is disposed on the base plate and includes a reflective film layer, a transmissive film layer, and a light guide spacer. The reflective film layer is located on the base plate. The transmissive film layer is located over the reflective film layer. The light guide spacer has an accommodating space. The reflective film layer and the transmissive film layer are respectively located at opposite sides of the light guide spacer. The light source is disposed between the reflective film layer and the transmissive film layer and located in the accommodating space. The keyswitch assembly is disposed on the membrane circuit board.

29 Claims, 7 Drawing Sheets

(56) References Cited

U.S. PATENT DOCUMENTS

| | | | |
|---|---|---|---|
| 2009/0128496 A1* | 5/2009 | Huang | G06F 3/0202 345/170 |
| 2009/0223794 A1 | 9/2009 | Lee et al. | |
| 2010/0288615 A1* | 11/2010 | Mafune | H01H 13/83 200/5 A |
| 2013/0313093 A1 | 11/2013 | Peng | |

* cited by examiner

KEYSWITCH DEVICE, KEYBOARD, AND MEMBRANE CIRCUIT BOARD

RELATED APPLICATIONS

This application claims priority to Taiwan Application Serial Number 105205076, filed Apr. 12, 2016, which is herein incorporated by reference.

BACKGROUND

Technical Field

The present disclosure relates to a keyswitch device, a keyboard, and a membrane circuit board, and more particularly, to a keyswitch device, a keyboard, and a membrane circuit board capable of emitting light.

Description of Related Art

Currently, the keyboard is one of the indispensable input devices to enter text or numbers while using a PC. Moreover, consumer electronic products used in daily life or large-scale processing equipment used in the industrial sector all require key structure units input devices to operate.

In order to make it easier to use in dark places, LED (Light-Emitting Diode) keyboards have been developed on the market for users, so that diversity of keyboards has been increased. U.S. Publication No. 20040174339 discloses a conventional illuminated keyboard including a light guide element and LEDs additionally installed on the keyboard. Lights emitted by the LEDs enter the light guide element, so as to be guided and uniformly outputted or transmitted to the keycaps. Current computer products are developed to be light, thin, short, and small, and keyboards are no exception. Under this development trend, owing to installing the light guide element, the above-mentioned illuminated keyboard does not match the requirement of thickness.

U.S. Publication No. 20090223794 discloses another conventional illuminated keyboard using a circuit board for light guiding and disposing a reflective plate under the circuit board and light sources at a side of the circuit board, so that light emitted by the light sources are transmitted to the keycaps by the circuit board. Most of conventional illuminated keyboards supply power to LEDs through flexible circuit boards. For cost considerations, the conventional illuminated keyboards usually dispose the LEDs in a certain small area, so as to avoid using flexible circuit boards with large areas. However, the configuration makes the keyswitches proximal to the LEDs receive lights with higher intensities and the keyswitches distal to the LEDs receive lights with lower intensities. In this regard, certain light-reflecting portions must be disposed on the light guide element to compensate the differences of the intensities by complicated ways, but the light-reflecting portions provide less effect and increase the difficulty of design. Moreover, the light sources are independently disposed outside the circuit board, which is difficult to meet the requirements of being waterproof and dustproof and may affect the reliability. Furthermore, circuit layouts on a circuit boards are mostly performed by applying a silver paste on substrates, but the materials of the substrates may easily be corroded by the silver paste, and the circuit layouts may affect the efficiency of outputting light, so that the luminous efficiency of products are affected.

U.S. Publication No. 20130313093 discloses another conventional illuminated keyboard, in which LEDs are respectively disposed under all keyswitches (or certain keyswitches), and the LEDs are directly disposed on the membrane circuit board by silver circuits and emit lights toward the keycaps of the keyswitches. However, the design needs a large number of LEDs, which may increase costs and consume more electricity. In addition, the silver circuits have large and different impedances, which may cause the unevenness of luminosity of the LEDs and greatly reduce the light-emitting effect of the keycaps. Nevertheless, the above-mentioned design may confine the light-emitting regions at small areas of the keycaps, which also affect the user's visual experience.

Accordingly, how to provide a keyswitch device to solve the aforementioned problems becomes an important issue to be solved by those in the industry.

SUMMARY

Accordingly, an aspect of the disclosure is to provide a keyswitch device, a keyboard, and a membrane circuit board that can effectively reduce the overall thickness of the device.

According to an embodiment of the disclosure, the keyswitch device includes a base plate, a membrane circuit board, a light source, and a keyswitch assembly. The membrane circuit board is disposed on the base plate and includes a reflective film layer, a transmissive film layer, and a light guide spacer. The reflective film layer is located on the base plate. The transmissive film layer is located over the reflective film layer. The light guide spacer has an accommodating space. The reflective film layer and the transmissive film layer are respectively located at opposite sides of the light guide spacer. The light source is disposed between the reflective film layer and the transmissive film layer and located in the accommodating space. The keyswitch assembly is disposed on the membrane circuit board.

In an embodiment of the disclosure, the light source is disposed on the reflective film layer and emits light toward the transmissive film layer.

In an embodiment of the disclosure, the light source is disposed on the transmissive film layer and emits light toward the reflective film layer.

In an embodiment of the disclosure, the transmissive film layer includes a transparent substrate. The transparent substrate is disposed with a reflective coating and a shielding coating to form a transmissive area. An orthogonal projection of the keyswitch assembly projected on the membrane circuit board covers the transmissive area. An orthogonal projection of the accommodating space projected on the transmissive film layer overlaps the reflective film layer.

In an embodiment of the disclosure, the transparent substrate has a top surface facing the keyswitch assembly. The reflective coating is disposed on the top surface. The shielding coating covers the reflective coating.

In an embodiment of the disclosure, the transparent substrate has a top surface and bottom surface. The top surface faces the keyswitch assembly. The bottom surface faces the light guide spacer. The shielding coating is disposed on the top surface. The reflective coating is disposed on the bottom surface.

In an embodiment of the disclosure, the light guide spacer further has a through hole located right under the keyswitch assembly. The reflective film layer includes a switch circuit. The transmissive film layer includes a conductive contact. The conductive contact is configured to contact the switch circuit via the through hole.

In an embodiment of the disclosure, the light guide spacer has a plurality of light-reflecting portions. The light-reflecting portions are located at a surface of the light guide spacer facing the reflective film layer and correspond to the keyswitch assembly.

In an embodiment of the disclosure, the light source is powered by a copper foil wire.

According to another embodiment of the disclosure, the keyboard includes a base plate, a membrane circuit board, a plurality of light sources, and a plurality of keyswitch assemblies. The membrane circuit board is disposed on the base plate and includes a reflective film layer, a transmissive film layer, and a light guide spacer. The reflective film layer is located on the base plate. The transmissive film layer is located over the reflective film layer. The light guide spacer has a plurality of accommodating spaces. The reflective film layer and the transmissive film layer are respectively located at opposite sides of the light guide spacer. The light sources are disposed between the reflective film layer and the transmissive film layer and respectively located in the accommodating spaces. The keyswitch assemblies are disposed on the membrane circuit board.

In an embodiment of the disclosure, the light guide spacer further has a plurality of through holes located right under the keyswitch assemblies respectively. The reflective film layer includes a switch circuit. The transmissive film layer includes a plurality of conductive contacts. The conductive contacts are configured to contact the switch circuit respectively via the through holes.

According to another embodiment of the disclosure, the membrane circuit board includes a reflective film layer, a transmissive film layer, a light guide spacer, and a light source. The transmissive film layer is located over the reflective film layer. The light guide spacer has an accommodating space. The reflective film layer and the transmissive film layer are respectively located at opposite sides of the light guide spacer. The light source is disposed between the reflective film layer and the transmissive film layer and located in the accommodating space.

Accordingly, in the keyswitch device, the keyboard, and the membrane circuit board of the present disclosure, the light source is disposed in the membrane circuit board, the light guide spacer disposed between the upper and lower film layers of the membrane circuit board provides the light guide function, and the upper and lower film layers provide functions of a shielding layer and a reflective layer. Hence, the overall thickness of the keyswitch device and that of the keyboard can be effectively reduced, and the manufacturing costs and assembly processes can also be reduced. In addition, compared with a conventional illuminated keyboard including a backlight module external to the membrane circuit board, the light sources of the keyboard of the present disclosure are components disposed in the membrane circuit board, so the locations of the light sources do not affect the manufacturing costs and can be uniformly distributed in the membrane circuit board, which makes the keyswitch devices obtain lights with a uniform and consistent intensity. Furthermore, in the keyboard of the present disclosure, each of the light sources corresponds to a specific number of adjacent keyswitch assemblies, so the number of the light sources can be reduced to further reduce the whole manufacturing costs.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible the same reference numbers are used in the drawings and the description to refer to the same or like parts.

Figure 1:
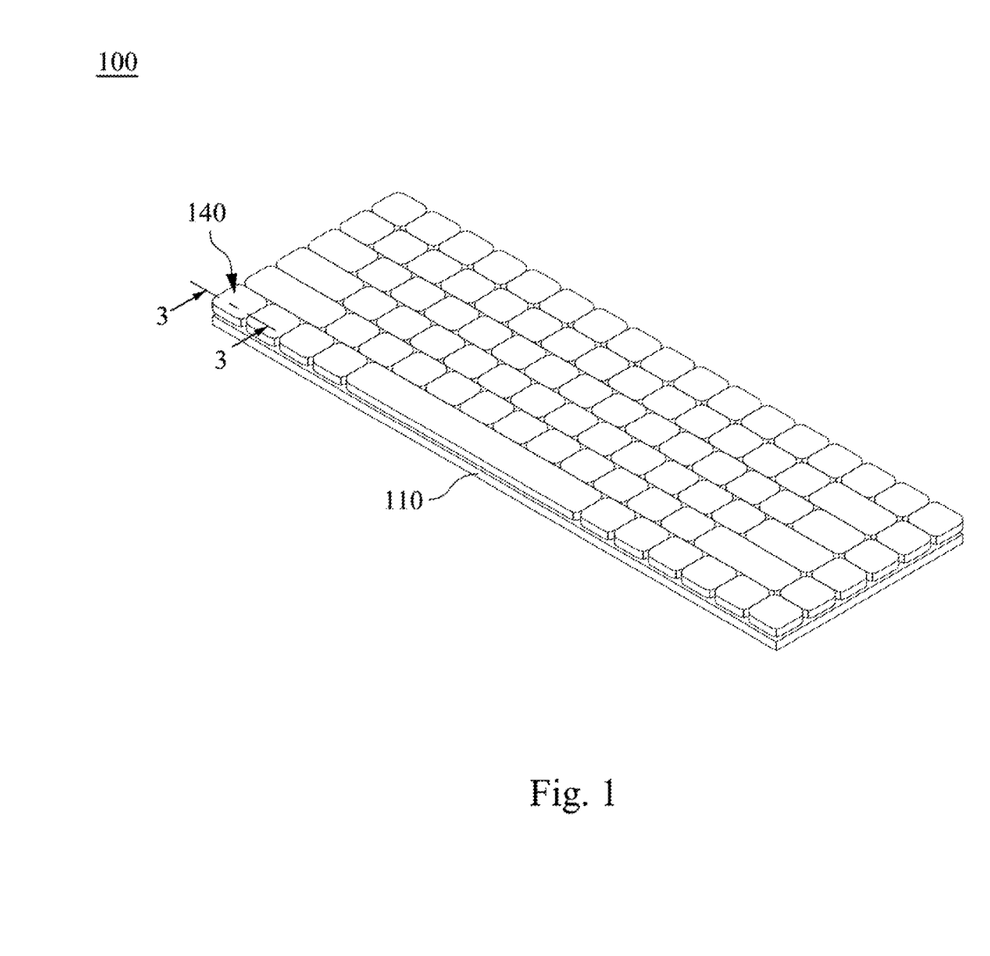
FIG. 1 is a perspective view of a keyboard according to an embodiment of the disclosure.

Reference is made to FIG. 1. FIG. 1 is a perspective view of a keyboard 100 according to an embodiment of the disclosure. As shown in FIG. 1, the keyboard 100 of the disclosure can be an external keyboard (e.g., a keyboard with a PS/2 interface or a keyboard with a USB interface) used in a desktop computer, or can be a part of a computer system having an input device that is in the form of a keyboard (e.g., a notebook computer or a laptop computer), but the disclosure is not limited in this regard. That is, the keyboard 100 of the disclosure can be used in any electronic product that adopts keyswitch devices to be the input interface.

Figure 2:
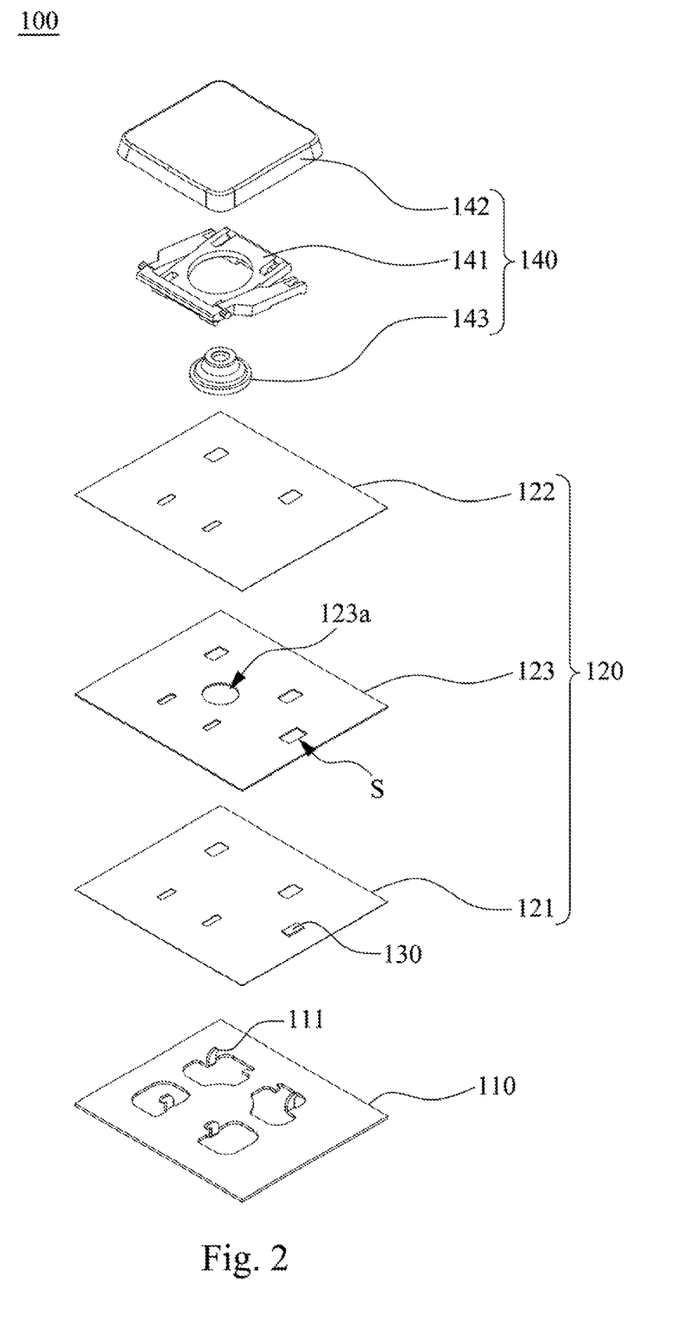
FIG. 2 is a partial exploded view of the keyswitch device in FIG. 1.
Figure 3:
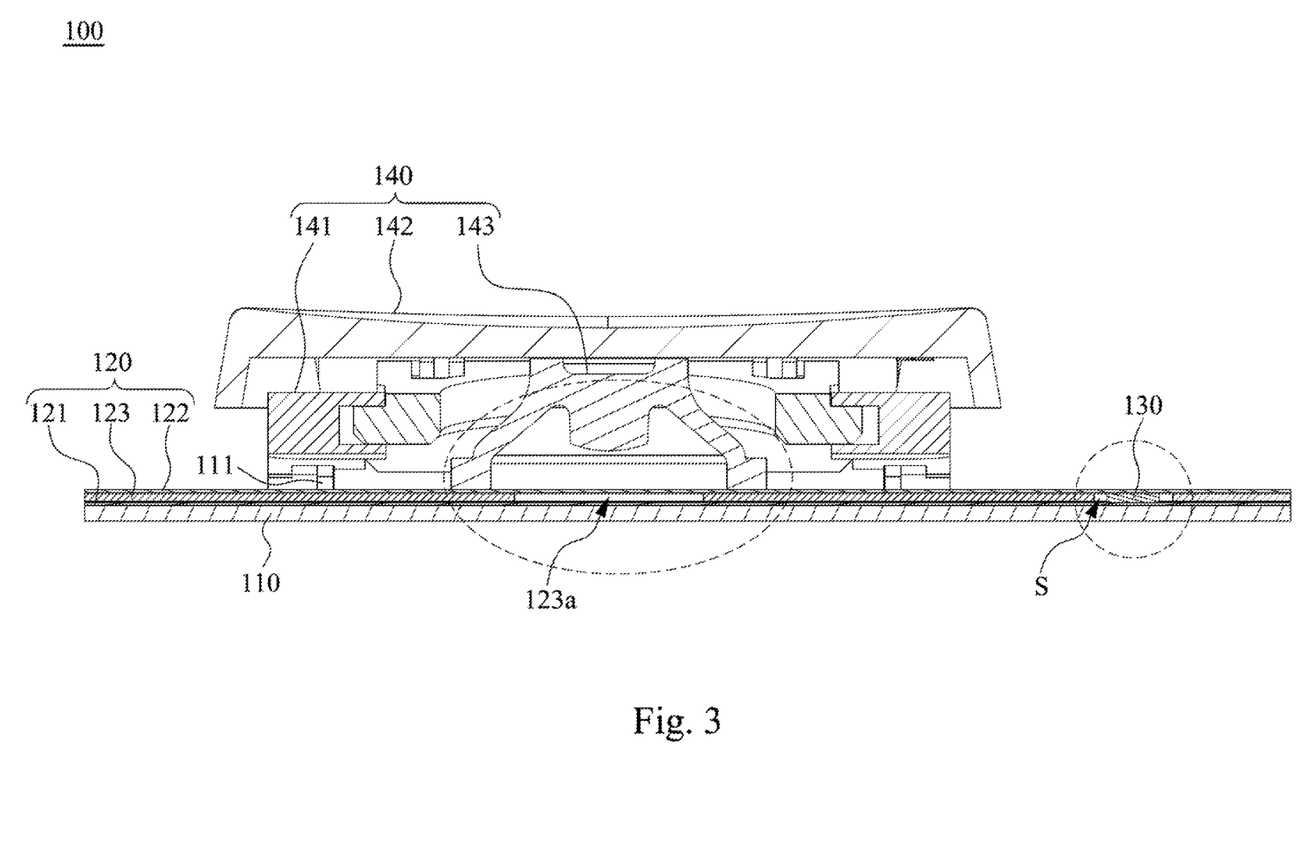
FIG. 3 is a cross-sectional view of the keyswitch device taken along line 3-3 in FIG. 1.

Reference is made to FIG. 2 and FIG. 3. FIG. 2 is a partial exploded view of the keyswitch device in FIG. 1. FIG. 3 is a cross-sectional view of the keyswitch device taken along line 3-3 in FIG. 1. As shown in FIGS. 1-3, in the embodiment, the keyboard 100 includes a base plate 110, a membrane circuit board 120, a plurality of light sources 130 (each of FIGS. 2 and 3 depicts one light source 130 as a representative), and a plurality of keyswitch assemblies 140, in which the combination of the base plate 110, the membrane circuit board 120, a single light sources 130, and a single keyswitch assembly can be regarded as an independent keyswitch device. The membrane circuit board 120 is disposed on the base plate 110. The keyswitch assembly 140 is disposed on the membrane circuit board 120.

Specifically, the base plate 110 has connecting portions 111. The membrane circuit board 120 correspondingly has a perforation (not shown) for the connecting portions 111 of the base plate 110 to pass through. The keyswitch assembly 140 includes a connecting member 141, a keycap 142, and a restoring member 143. In the embodiment, the connecting member 141 is connected between the keycap 142 and the connecting portions 111 of the base plate 110 and formed by pivotally connecting two linkages, so as to make the keycap 142 move upwards and downwards relative to the base plate 110. The restoring member 143 is disposed over the membrane circuit board 120 and located between the keycap 142 and the membrane circuit board 120. When the keycap 142 is pressed downwards by an external force, the restoring member 143 generates a counterforce to the keycap 142 so as to provide users the feeling of pressing. When the external force applied onto the keycap 142 is released, the restoring member 143 can provide a restoring force for returning the keycap 142 back to its original position at which the keycap 142 is not pressed. In the embodiment, the restoring member 143 is a resilient member.

In a practical application, the connecting member 141 can be replaced by other supporting structure having similar function (i.e., making the keycap 142 move upwards and downwards relative to the base plate 110), such as a V-shaped linkage structure, an A-shaped linkage structure, or a linkage structure having two parallel linkages. The restoring member 143 can be replaced by other component having similar function, such as magnetic components.

As shown in FIGS. 2 and 3, in the embodiment, the membrane circuit board 120 includes a reflective film layer 121, a transmissive film layer 122, and a light guide spacer 123. The reflective film layer 121 is located on the base plate 110. The transmissive film layer 122 is located over the reflective film layer 121. The reflective film layer 121 and the transmissive film layer 122 are respectively located at opposite sides of the light guide spacer 123. That is, the reflective film layer 121 and the transmissive film layer 122 are separated owing to the thickness of the light guide spacer 123. The light guide spacer 123 has a plurality of through holes 123a (each of FIGS. 2 and 3 depicts one through hole 123a as a representative). The through holes 123a are respectively located right under the keyswitch assemblies 140.

Figure 4:
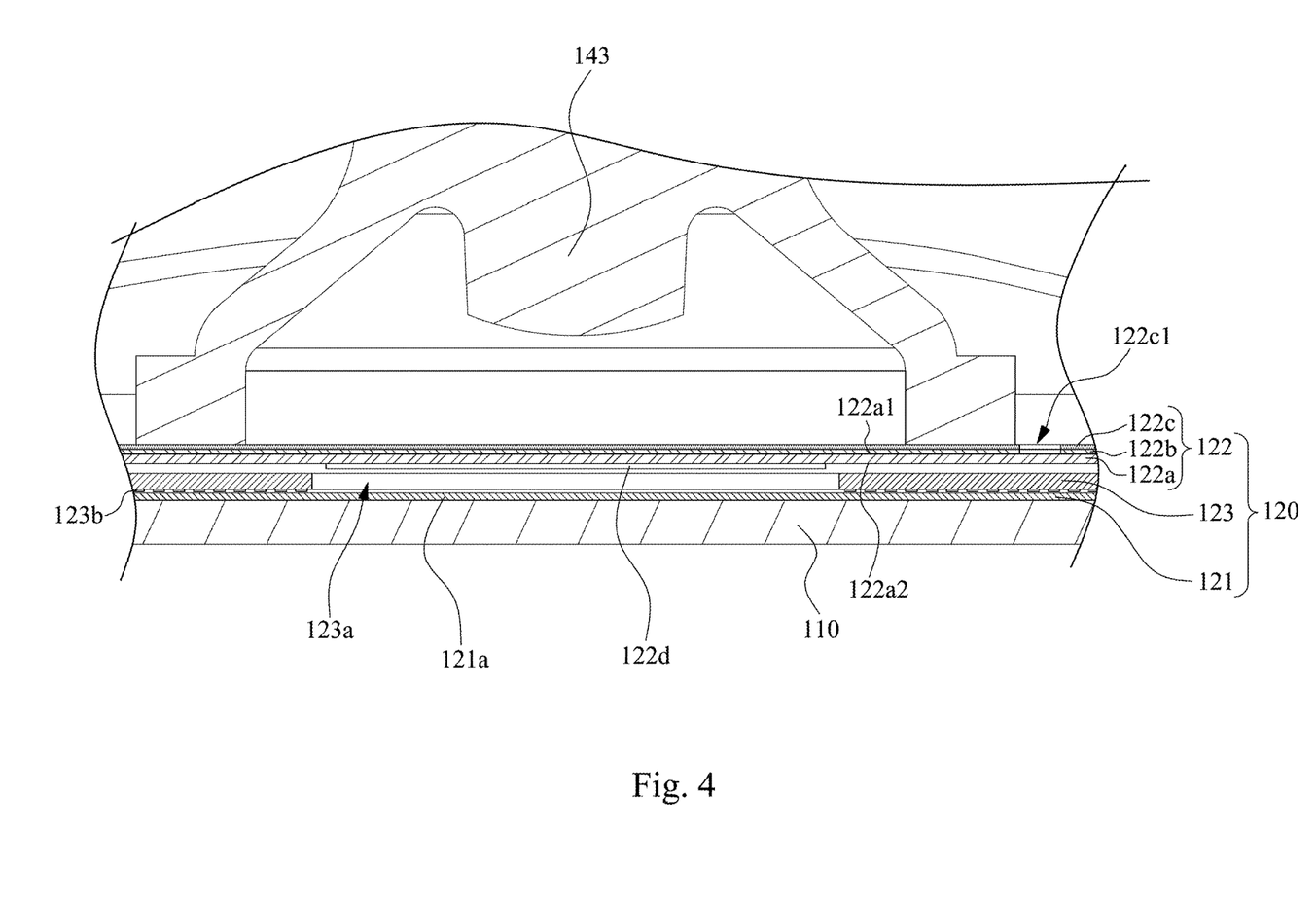
FIG. 4 is a partial cross-sectional view of a membrane circuit board according to an embodiment of the disclosure.

Reference is made to FIG. 4. FIG. 4 is a partial cross-sectional view of the membrane circuit board 120 according to an embodiment of the disclosure. As shown in FIG. 4, the reflective film layer 121 includes a switch circuit 121a. The transmissive film layer 122 includes a plurality of conductive contacts 122d (each of FIGS. 2-4 depicts one through hole 123a as a representative) separated from each other. The conductive contacts 122d are configured to contact the switch circuit 121a respectively via the through holes 123a. Specifically, when the keycap 142 is not pressed, the conductive contact 122d on the transmissive film layer 122 and the switch circuit 121a on the reflective film layer 121 are separated at opposite sides of the light guide spacer 123 and electrically isolated. When the keycap 142 is pressed to move toward the base plate 110, the keycap 142 will directly or indirectly push the transmissive film layer 122 to partially enter the through hole 123a of the light guide spacer 123, so as to make the conductive contact 122d on the transmissive film layer 122 pass through the through hole 123a of the light guide spacer 123 to contact the switch circuit 121a on the reflective film layer 121 (the trigger behavior is performed by pushing the transmissive film layer 122 to trigger the switch circuit 121a by the restoring member 143 in the embodiment). Hence, the switch circuit 121a immediately generates a trigger signal corresponding to the pressed keyswitch device. In some embodiments, the switch circuit 121a is in form of an interdigital electrode. It should be pointed out that because the switch circuit 121a is disposed on the reflective film layer 121, the transmissive film layer 122 can be disposed with the conductive contacts 122d without a complicated switch circuit, so as to prevent the lights from blocked by the switch circuit, and thus the light transmission efficiency of the transmissive film layer 122 can be increased.

In addition, as shown in FIG. 3, the light guide spacer 123 has a plurality of accommodating spaces S (each of FIGS. 2-4 depicts one accommodating space S as a representative). The light sources 130 are disposed between the reflective film layer 121 and the transmissive film layer 122 and respectively located in the accommodating spaces S. It can be seen that in the structural configuration of the keyboard 100 of the embodiment, the light sources 130 are disposed in the membrane circuit board 120, and the light guide spacer 123 disposed between the reflective film layer 121 and the transmissive film layer 122 of the membrane circuit board 120 provides the light guide function. Hence, the overall thickness of the keyswitch device and that of the keyboard 100 can be effectively reduced.

Figure 5:
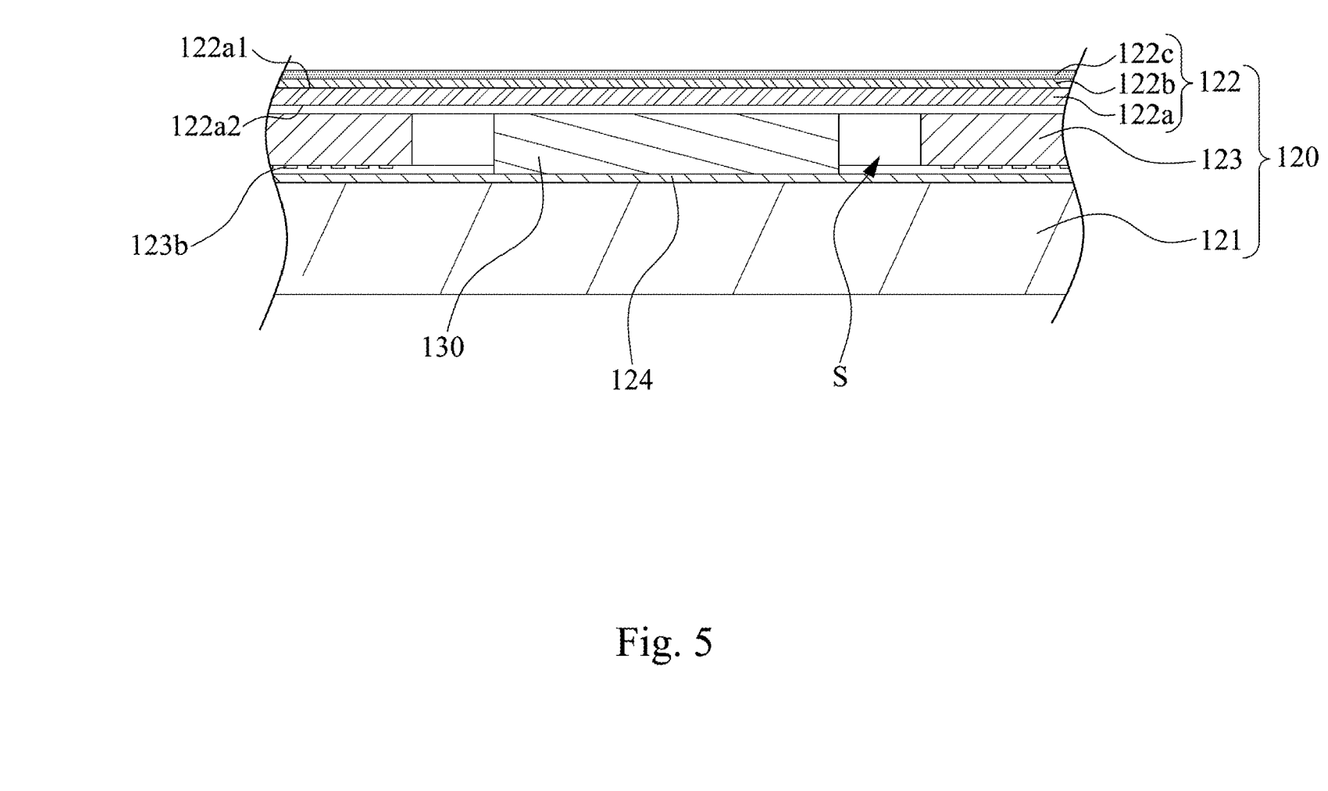
FIG. 5 is a partial cross-sectional view of the membrane circuit board according to another embodiment of the disclosure.

Reference is made to FIG. 5. FIG. 5 is a partial cross-sectional view of the membrane circuit board 120 according to another embodiment of the disclosure. As shown in FIGS. 4 and 5, in the embodiment, the transmissive film layer 122 includes a transparent substrate 122a. The transparent substrate 122a is disposed with a reflective coating 122b and a shielding coating 122c. The transparent substrate 122a has a top surface 122a 1 and bottom surface 122a 2. The top surface 122a 1 of the transparent substrate 122a faces the keyswitch assembly 140. The bottom surface 122a 2 of the transparent substrate 122a faces the light guide spacer 123. The reflective coating 122b is disposed on the top surface 122a 1 of the transparent substrate 122a, and the shielding coating 122c covers the reflective coating 122b. The place where is not coated with the reflective coating 122b and a shielding coating 122c forms a transmissive area 122c 1 (referring to FIG. 4). An orthogonal projection of the keyswitch assembly 140 projected on the membrane circuit board 120 corresponds to (e.g., covers) the transmissive area 122c 1. The membrane circuit board 120 further includes a power supply circuit 124 disposed on the reflective film layer 121. The light source 130 is disposed on the reflective film layer 121 and powered by the power supply circuit 124.

In the embodiment, the light sources 130 are a top emission type LED, and orthogonal projections of the accommodating spaces S of the light guide spacer 123 projected on the transmissive film layer 122 overlap the reflective film layer 122b. Hence, the lights emitted toward the transmissive film layer 122 by the light sources 130 will be reflected by the reflective coating 122b so to enter and be transmitted in the light guide spacer 123. Owing to the reflective function provided by the reflective film layer 121 and the reflective coating 122b of the transmissive film layer 122, it can be ensured that the lights emitted by the light sources 130 can be efficiently transmitted in the light guide spacer 123, and the lights around the light sources 130 can be reflected and shielded, so as to prevent the brightness around the light sources 130 from being too high and thus improve the uniformity of the lights. When the transmitted lights reach the transmissive area 122c 1 formed at the place where is not coated with the reflective coating 122b and a shielding coating 122c (as shown in FIG. 4), the lights will further reach the corresponding keyswitch assembly 140 through the transmissive area 122c 1, so as to illuminate the corresponding keyswitch assembly 140. In addition, by disposing the light sources 130 in the membrane circuit board 120, the effects of waterproofing and dustproofing to the light sources 130 can be achieved.

In a practical application, the number of the transmissive areas 122c 1 corresponding to each of the keyswitch assemblies 140 can be flexibly adjusted according to actual requirements, and the shapes of the transmissive areas 122c 1 can also be flexibly adjusted.

In the embodiment, the light guide spacer 123 has a plurality of light-reflecting portions 123b. The light-reflecting portions 123b can be located at the top surface or the bottom surface of the light guide spacer 123. In the embodiment, the light-reflecting portions 123b are located at the bottom surface of the light guide spacer 123. In some embodiments, the light-reflecting portions 123b can form a reflective dot pattern or concave structures. By adjusting the shapes, sizes, and arrangement of the light-reflecting portions 123b, the lights transmitted at any location in the light guide spacer 123 can have a uniform and consistent intensity.

Therefore, compared with a conventional illuminated keyboard including a backlight module external to the membrane circuit board, the light sources 130 of the keyboard 100 of the present disclosure are components disposed in the membrane circuit board 120, so the locations of the light sources 130 do not affect the manufacturing costs and can be uniformly distributed in the membrane circuit board 120, which makes the keyswitch devices obtain lights with a uniform and consistent intensity. In addition, compared with a conventional illuminated keyboard, the membrane circuit board 120 of the present disclosure and the light sources 130 therein can be directly manufactured as a single module, so the raw material costs and assembly steps can be saved due to the reduction of assembly components.

Figure 6:
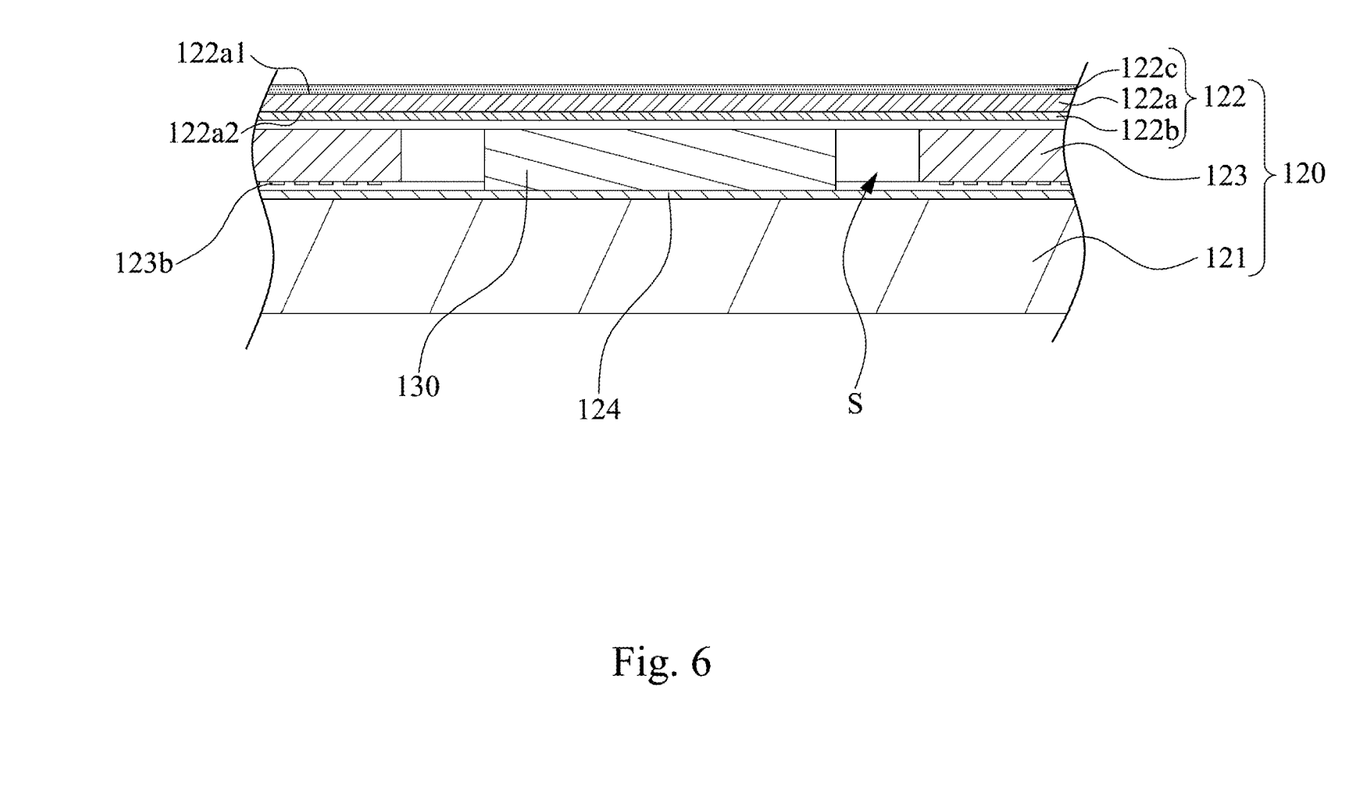
FIG. 6 is a partial cross-sectional view of the membrane circuit board according to another embodiment of the disclosure.

Reference is made to FIG. 6. FIG. 6 is a partial cross-sectional view of the membrane circuit board 120 according to another embodiment of the disclosure. As shown in FIG. 6, in the embodiment, the transmissive film layer 122 also includes the transparent substrate 122a. The transparent substrate 122a is disposed with the reflective coating 122b and the shielding coating 122c. The difference between the membrane circuit board 120 of the present embodiment and the membrane circuit board 120 in FIG. 5 is that the shielding coating 122c of the present embodiment is disposed on the top surface 122a 2 of the transparent substrate 122a and the reflective coating 122b is disposed on the bottom surface 122a 1 of the transparent substrate 122a.

Under the structural configuration, the light emitted towards the transmissive film layer 122 by the light sources 130 will be directly reflected by the reflective coating 122b to enter and be transmitted in the light guide spacer 123. Owing to the reflective function provided by the reflective film layer 121 and the reflective coating 122b of the transmissive film layer 122, it can be ensured that the light emitted by the light sources 130 can be efficiently transmitted in the light guide spacer 123. When the transmitted light reaches the transmissive area 122c 1 (as shown in FIG. 4), the lights will further reach the corresponding keyswitch assembly 140 through the transmissive area 122c 1, so as to illuminate the corresponding keyswitch assembly 140. In other words, the reflective coating 122b and the shielding coating 122c of the membrane circuit board 120 shown in FIG. 5 are located outside the membrane circuit board 120, but the reflective coating 122b and the shielding coating 122c of the membrane circuit board 120 shown in FIG. 6 are respectively located inside and outside the membrane circuit board 120. In another embodiment, the reflective coating 122b and the shielding coating 122c can be disposed on the bottom surface 122a 1 of the transparent substrate 122a.

Figure 7:
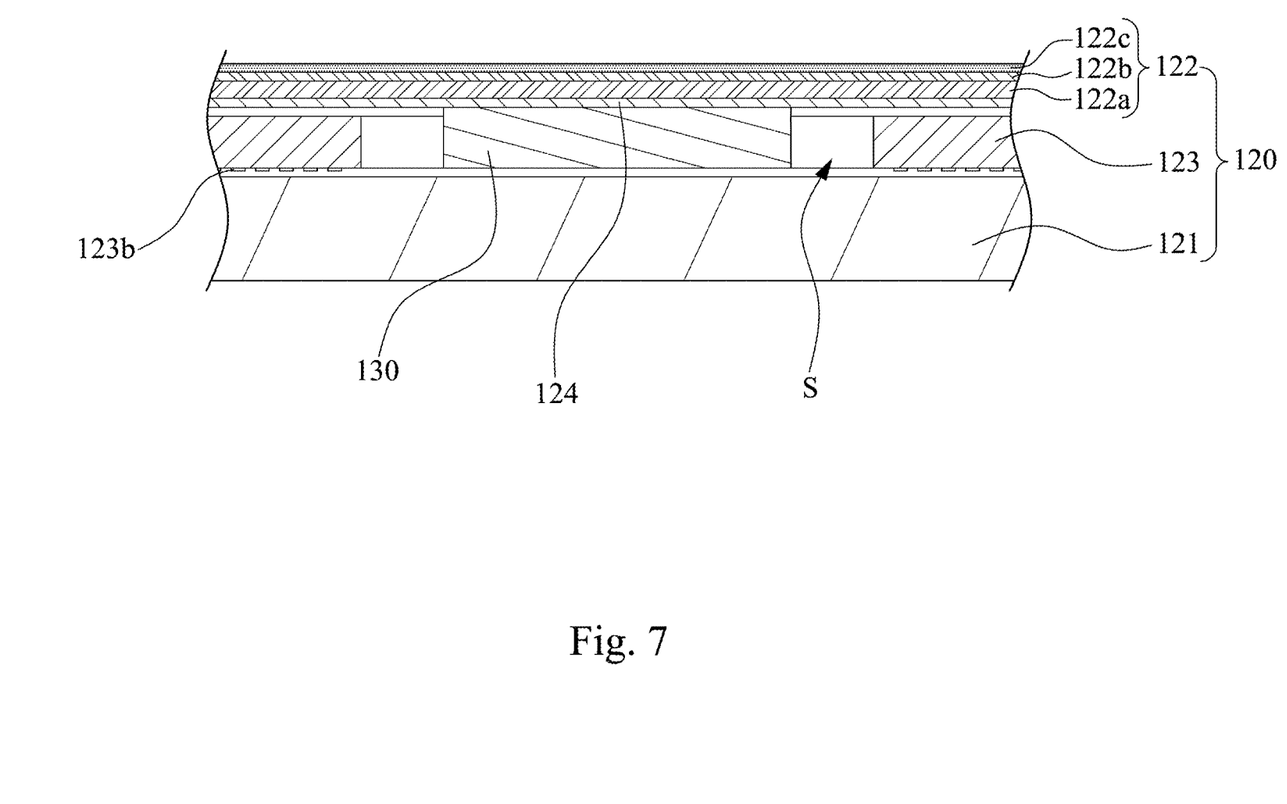
FIG. 7 is a partial cross-sectional view of the membrane circuit board according to another embodiment of the disclosure.

Reference is made to FIG. 7. FIG. 7 is a partial cross-sectional view of the membrane circuit board 120 according to another embodiment of the disclosure. As shown in FIG. 7, in the embodiment, the membrane circuit board 120 also includes the reflective film layer 121, the transmissive film layer 122, and the light guide spacer 123. The light sources 130 are located in the membrane circuit board 120. Orthogonal projections of the accommodating spaces S of the light guide spacer 123 projected on the transmissive film layer 122 overlaps the reflective film layer 122b. The difference between the membrane circuit board 120 of the present embodiment and the membrane circuit board 120 in FIG. 5 is that the light sources 130 of the present embodiment are disposed on the transmissive film layer 122 and emits light toward the reflective film layer 121. Specifically, in the embodiment, the power supply circuit 124 is disposed on the transmissive film layer 122 to supply power to the light sources 130.

Under the structural configuration, the light emitted toward the reflective film layer 121 by the light sources 130 will be directly reflected by the reflective film layer 121 to enter and be transmitted in the light guide spacer 123. Owing to the reflective function provided by the reflective film layer 121 and the reflective coating 122b of the transmissive film layer 122, it can be ensured that the light emitted by the light sources 130 can be efficiently transmitted in the light guide spacer 123 and can prevent the brightness around the light sources 130 from being too high. When the transmitted light reaches the transmissive area 122c 1 (as shown in FIG. 4), the light will further reach the corresponding keyswitch assembly 140 through the transmissive area 122c 1, so as to illuminate the corresponding keyswitch assembly 140.

In some embodiments, the base plate 110 can be manufactured by hard materials (e.g., metals or plastics), but the disclosure is not limited in this regard.

In some embodiments, the reflective film layer 121 is a substrate manufactured by a non-transparent material having reflective effect, or can be manufactured by printing ink having reflective effect onto a substrate.

In some embodiments, the power supply circuit 124 for the light sources 130 can be manufactured by copper foil wires, so as to reduce the impedance of the power supply circuit 124 and prevent the copper foil wires from having different impedances due to different lengths, and thus the light sources 130 can have a consistent brightness. Moreover, the copper foil wires can be implemented with a small wire width, so as to increase the flexibility of layout, but the disclosure is not limited in this regard. In addition, the switch circuit 121a disposed on the reflective film layer 121 can also be manufactured by a copper foil wire, or printed by silver paste, but the disclosure is not limited in this regard.

According to the foregoing recitations of the embodiments of the disclosure, it can be seen that in the keyswitch device, the keyboard, and the membrane circuit board of the present disclosure, the light source is disposed in the membrane circuit board, the light guide spacer disposed between the upper and lower film layers of the membrane circuit board provides the light guide function, and the upper and lower film layers provide functions of a shielding layer and a reflective layer. Hence, the overall thickness of the keyswitch device and that of the keyboard can be effectively reduced, and the manufacturing costs and assembly processes can also be reduced. In addition, compared with a conventional illuminated keyboard including a backlight module external to the membrane circuit board, the light sources of the keyboard of the present disclosure are components disposed in the membrane circuit board, so the locations of the light sources do not affect the manufacturing costs and can be uniformly distributed in the membrane circuit board, which makes the keyswitch devices obtain light with a uniform and consistent intensity. Furthermore, in the keyboard of the present disclosure, each of the light sources corresponds to a specific number of adjacent keyswitch assemblies, so the number of the light sources can be reduced to further reduce the whole manufacturing costs.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A keyswitch device, comprising:
   a base plate;
   a membrane circuit board disposed on the base plate, the membrane circuit board comprising:
      a reflective film layer located on the base plate;
      a transmissive film layer located over the reflective film layer;
      a light guide spacer film layer having an accommodating space, wherein the reflective film layer and the transmissive film layer are respectively located at opposite sides of the light guide spacer film layer; and
      a power supply circuit,
   a light source sandwiched between the reflective film layer and the transmissive film layer, located in the accommodating space, and spaced apart from the base plate, wherein the light source is powered by the power supply circuit; and
   a keyswitch assembly disposed on the membrane circuit board.

2. The keyswitch device of claim 1, wherein the light source is disposed on the reflective film layer and emits light toward the transmissive film layer.

3. The keyswitch device of claim 1, wherein the light source is disposed on the transmissive film layer and emits light toward the reflective film layer.

4. The keyswitch device of claim 1, wherein the light guide spacer film layer further has a through hole located right under the keyswitch assembly, the reflective film layer comprises a switch circuit, the transmissive film layer comprises a conductive contact, and the conductive contact is configured to contact the switch circuit via the through hole.

5. The keyswitch device of claim 1, wherein the light guide spacer film layer has a plurality of light-reflecting portions.

6. The keyswitch device of claim 1, wherein the light source is powered by a copper foil wire.

7. The keyswitch device of claim 1, wherein the transmissive film layer comprises:
   a transparent substrate disposed with a reflective coating and a shielding coating to form a transmissive area, wherein an orthogonal projection of the keyswitch assembly projected on the membrane circuit board covers the transmissive area.

8. The keyswitch device of claim 7, wherein an orthogonal projection of the accommodating space projected on the transmissive film layer overlaps the reflective film layer.

9. The keyswitch device of claim 7, wherein the transparent substrate has a top surface facing the keyswitch assembly, the reflective coating is disposed on the top surface, and the shielding coating covers the reflective coating.

10. The keyswitch device of claim 7, wherein the transparent substrate has a top surface and bottom surface, the top surface faces the keyswitch assembly, the bottom surface faces the light guide spacer film layer, the shielding coating is disposed on the top surface, and the reflective coating is disposed on the bottom surface.

11. A keyboard, comprising:
    a base plate;
    a membrane circuit board disposed on the base plate, the membrane circuit board comprising:
       a reflective film layer located on the base plate;
       a transmissive film layer located over the reflective film layer;
       a light guide spacer film layer having a plurality of accommodating spaces, wherein the reflective film layer and the transmissive film layer are respectively located at opposite sides of the light guide spacer film layer; and
       a power supply circuit;
    a plurality of light sources sandwiched between the reflective film layer and the transmissive film layer, respectively located in the accommodating spaces, and spaced apart from the base plate, wherein the light sources are powered by the power supply circuit; and
    a plurality of keyswitch assemblies disposed on the membrane circuit board.

12. The keyboard device of claim 11, wherein the light sources are disposed on the reflective film layer and emit lights toward the transmissive film layer.

13. The keyboard device of claim 11, wherein the light sources are disposed on the transmissive film layer and emit lights toward the reflective film layer.

14. The keyboard device of claim 11, wherein the light guide spacer film layer further has a plurality of through holes located right under the keyswitch assemblies respectively, the reflective film layer comprises a switch circuit, the transmissive film layer comprises a plurality of conductive contacts, and the conductive contacts are configured to contact the switch circuit respectively via the through holes.

15. The keyboard device of claim 11, wherein the light guide spacer film layer has a plurality of light-reflecting portions.

16. The keyboard device of claim 11, wherein the light sources are powered by a copper foil wire.

17. The keyboard device of claim 11, wherein the transmissive film layer comprises:
    a transparent substrate disposed with a reflective coating and a shielding coating forming a plurality of transmissive areas, wherein orthogonal projections of the keyswitch assemblies projected on the membrane circuit board cover the transmissive areas.

18. The keyboard device of claim 17, wherein orthogonal projections of the accommodating spaces projected on the transmissive film layer overlap the reflective film layer.

19. The keyboard device of claim 17, wherein the transparent substrate has a top surface facing the keyswitch assemblies, the reflective coating is disposed on the top surface, and the shielding coating covers the reflective coating.

20. The keyboard device of claim 17, wherein the transparent substrate has a top surface and bottom surface, the top surface faces the keyswitch assemblies, the bottom surface faces the light guide spacer film layer, the shielding coating is disposed on the top surface, and the reflective coating is disposed on the bottom surface.

21. A membrane circuit board, comprising:
    a reflective film layer;
    a transmissive film layer located over the reflective film layer;
    a light guide spacer film layer having an accommodating space, wherein the reflective film layer and the transmissive film layer are respectively located at opposite sides of the light guide spacer film layer;
a power supply circuit; and
a light source sandwiched between the reflective film layer and the transmissive film layer and located in the accommodating space, wherein the light source is powered by the power supply circuit.

22. The membrane circuit board of claim 21, wherein the light source is disposed on the reflective film layer and emits light toward the transmissive film layer.

23. The membrane circuit board of claim 21, wherein the light source is disposed on the transmissive film layer and emits light toward the reflective film layer.

24. The membrane circuit board of claim 21, wherein the light guide spacer film layer further has a through hole, the reflective film layer comprises a switch circuit, the transmissive film layer comprises a conductive contact, and the conductive contact is configured to contact the switch circuit via the through hole.

25. The membrane circuit board of claim 21, wherein the light guide spacer film layer has a plurality of light-reflecting portions.

26. The membrane circuit board of claim 21, wherein the light source is powered by a copper foil wire.

27. The membrane circuit board of claim 21, wherein the transmissive film layer comprises:
a transparent substrate disposed with a reflective coating and a shielding coating to form a transmissive area, wherein an orthogonal projection of the accommodating space projected on the transmissive film layer overlaps the reflective film layer.

28. The membrane circuit board of claim 27, wherein the transparent substrate has a top surface, the reflective coating is disposed on the top surface, and the shielding coating covers the reflective coating.

29. The membrane circuit board of claim 27, wherein the transparent substrate has a top surface and bottom surface, the bottom surface faces the light guide spacer film layer, the shielding coating is disposed on the top surface, and the reflective coating is disposed on the bottom surface.

* * * * *